United States Patent
Turner

(10) Patent No.: US 6,212,084 B1
(45) Date of Patent: Apr. 3, 2001

(54) ACTIVE RECTIFIER

(75) Inventor: Nicholas Malcolm Holmes Turner, Crowthorne (GB)

(73) Assignee: Page Aerospace Limited, Middlesex (GB)

(*) Notice: Subject to any disclaimer, the term of this patent is extended or adjusted under 35 U.S.C. 154(b) by 0 days.

(21) Appl. No.: 09/315,004

(22) Filed: May 17, 1999

(51) Int. Cl.[7] .................................................. H02M 7/217
(52) U.S. Cl. ............................................................ 363/127
(58) Field of Search ............................... 363/127, 84, 89; 327/354, 432, 433, 104, 108; 323/273

(56) References Cited

U.S. PATENT DOCUMENTS

| | | | |
|---|---|---|---|
| 5,153,453 | 10/1992 | Walters | 307/317.1 |
| 5,523,940 | * 6/1996 | Wymelenberg | 363/127 |
| 5,828,244 | * 10/1998 | Palara et al. | 327/108 |

OTHER PUBLICATIONS

Electronics World magazine article entitled Circuit Ideas, Mar. 1999 issue, p. 237.
International Rectifier Design Tips magazine article entitled Synchronous Rectifiers Improve Efficiency in Low Output Voltage Forward Converters, by S. Clemente, J.J. Fure, and L. Kiraly.

* cited by examiner

Primary Examiner—Peter S Wong
Assistant Examiner—Gary L. Laxton
(74) Attorney, Agent, or Firm—Leydig, Voit & Mayer, Ltd.

(57) ABSTRACT

An active rectifier including an anode terminal, a cathode terminal, a MOSFET operable to allow current flow from the anode to the cathode, a voltage sensing circuit operable to sense the voltage between the anode and cathode terminals and a gate drive circuit responsive to the voltage sensing circuit and operable to drive the gate of the MOSFET such that the MOSFET conducts when the voltage at the cathode terminal is less than that at the anode terminal and such that the conduction occurs substantially in the linear operating region of the MOSFET.

12 Claims, 7 Drawing Sheets

ACTIVE RECTIFIER

FIELD OF INVENTION

This invention relates to an active rectifier.

BACKGROUND ART

Conventional rectifier circuits use either bipolar or Schottky diodes, both of which suffer from deficiencies.

Firstly, bipolar diodes have a higher forward voltage drop than Schottky diodes, so tending to introduce unacceptable power losses in high current circuits. In addition, reverse recovery currents can be large if the diode is switched from full conduction to blocking in a low impedance circuit. These currents can increase circuit stresses and power losses, as well as contributing to EMI (electromagnetic interference) from the host equipment.

Secondly, Schottky diodes, while possessing the advantage of lower forward voltage drops than comparable bipolar types, tend to show a more rapid rise of leakage current with temperature. This can lead to excessive power dissipation if reverse voltages are high.

It has been recognised that a power MOSFET (metal oxide semiconductor field effect transistor) possesses good characteristics for a rectifier. The forward voltage drop in 'gate-on' mode can be very low and there is very little reverse recovery current at low frequencies of operation if the drain/body diode of the MOSFET does not carry the forward current. Also, high leakage currents do not occur and most MOSFETs can avalanche safely when subjected to overvoltage transients.

A number of circuits exist in which MOSFETs are used as active rectifiers, but these suffer from problems of control and timing. For example, if the active rectifier drive in a switched mode power supply is taken from the overall control circuit, which is often on the primary side of an isolation transformer, some means must be found to drive the active rectifier on the secondary side. This might involve the use of a second transformer. Because of different leakage inductance effects in the two transformers, this arrangement can give rise to imperfect timing between the main transformer output and the active rectifier drive. This causes power losses.

An alternative is to take the active rectifier drive from an overwind on the main transformer. However, this complicates the design of the transformer and is still not as good as using the actual secondary output since leakage inductance can again affect timing.

Other solutions offer secondary-side control and are based on switching the MOSFET by means of a comparator circuit. An example of a comparator based rectifier is given on page 237 of Electronics World for March 1999. Although the circuit of the present invention has some similarities to this approach, the design differs at least in that the control circuit and MOSFET operate in the linear mode.

This major difference reduces the problems caused by operating devices in the saturated mode, which saturation increases the time taken to change from one state to the other. The result of this time increase in switching the MOSFET OFF gives rise to an effect similar to reverse recovery current in a conventional diode.

SUMMARY OF THE INVENTION

In accordance with the invention there is provided an active rectifier comprising an anode terminal, a cathode terminal, a MOSFET operable to allow current flow from the anode to the cathode, a voltage sensing circuit operable to sense the voltage between the anode and cathode terminals and a gate drive circuit responsive to the voltage sensing circuit and operable to drive the gate of the MOSFET such that the MOSFET conducts when the voltage at the cathode terminal is less than that at the anode terminal and such that the conduction occurs substantially in the linear operating region of the MOSFET.

In a second aspect, the invention provides a rectifier circuit including the active rectifier of the first aspect.

In a third aspect, the invention provides a regulator circuit including the active rectifier of the first aspect.

In a fourth aspect, the invention provides a converter circuit including the active rectifier of the first aspect.

Embodiments of active rectifiers in accordance with the invention and applications of the active rectifier will now be described by way of example with reference to the drawings.

DETAILED DESCRIPTION OF THE PREFERRED EMBODIMENTS

Figure 1:
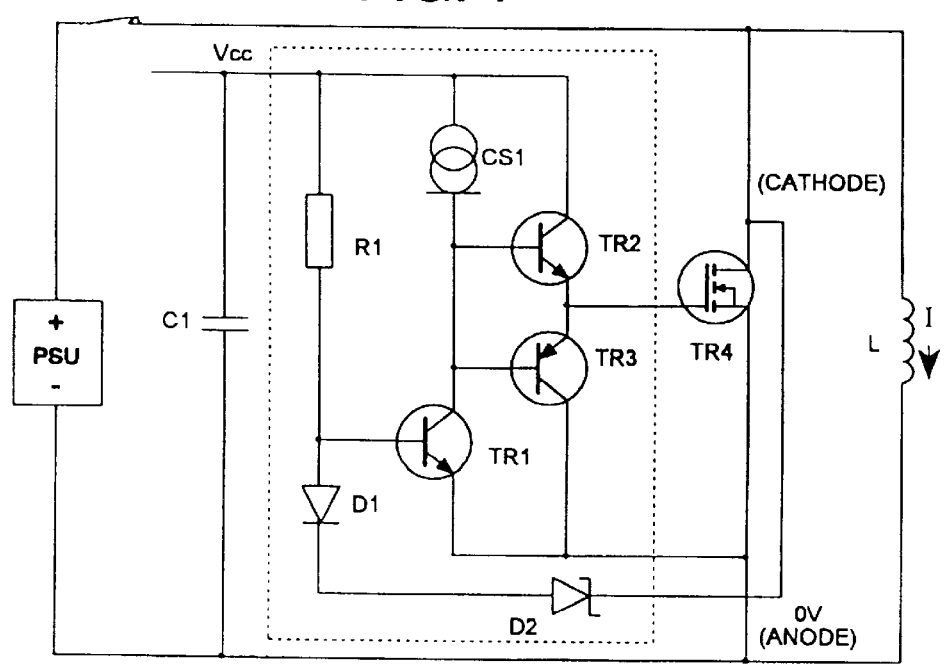
FIG. 1 is a schematic circuit diagram of the active rectifier connected in a simple inductive circuit.

With reference to FIG. 1, an active rectifier consists of a field effect transistor TR4 together with a drive part (shown within a dotted outline) which could be manufactured as an integrated circuit. For the purposes of illustrating the operation of the active rectifier, FIG. 1 also shows a power supply PSU, a switch S1, a capacitor C1 and a load inductance L.

In addition to the field effect transistor TR4, the drive part consists of a conventional gate drive transistor pair TR2 and TR3 with a current pull-up CS1 (such as a current diode), and a voltage sensing circuit consisting of R1, TR1, D1 and D2. Although an auxiliary supply Vcc is shown as being required for the circuit to operate, such a supply can be obtained from the reverse voltage across the rectifier. Suggestions for its derivation are shown in the Figures.

In low frequency circuits it is possible to replace CS1 by a resistor. D1 provides temperature compensation for the base/emitter voltage drop of TR1. It also eliminates the effect of that voltage drop on the operation of the circuit. C1 ensures a low impedance source for gate drive transistor TR2.

With S1 closed, the voltage across the inductor L causes the current flowing from the power supply to increase at a constant rate. Because the voltage across TR4 equals that of the supply, D1 and D2 are both reversed biased, thus allowing all the current flowing in R1 to flow into the base of TR1. This maintains TR1 in an 'ON' state, which holds the gate of TR4 at zero. TR4 is therefore 'OFF'.

When S1 opens, the voltage on the drain of TR4 falls rapidly until it reaches the point below 0V where D1 and D2 begin to conduct in the forward direction. Current is then diverted from the base of TR1, resulting in TR1 beginning to switch 'OFF' and TR4 beginning to turn 'ON'. With TR4 in conduction, inductor current flows upwards through it, from the anode of the rectifier to the cathode. TR4 does not saturate because the drive part receives feedback via D1 and D2. The 'ON' voltage across TR4 is thereby adjusted by TR1, to equal the forward voltage drop of D2. This diode provides the reference voltage for the active rectifier feedback circuit. For good circuit efficiency, the voltage across D2 is made low by an appropriate choice of R1.

The significant advantage of feedback operation of the overall circuit is that no device operates in a saturated condition, which is an important factor in the ability of the circuit to move rapidly from a conducting to a non-conducting state. In this embodiment, the critical element is TR1, which varies the level of drive to the gate of TR4 to satisfy the voltage balance requirement described at the end of the previous paragraph. Because it does not saturate when TR4 is conducting, the problems of storage time, due to base overdrive in this device, never arise.

It is important that the drain/source parasitic diode of TR4 does not conduct immediately prior to circuit turn-off, otherwise "reverse-recovery" currents can be generated. This is especially true for high-frequency operation.

In practice the rectifier system cannot turn on instantaneously because the gate-drive voltage risetime is limited by drive current and MOSFET gate capacitance effects. Drive current itself is limited by the value of CS1 and the current gain of TR2. The current from CS1 is affected by local parasitic capacitors. The most significant of these is the collector base capacitance of TR1. When S1 opens, the initial clamping of the negative-going voltage on the drain of TR4 is accomplished by its drain/source parasitic diode. Conduction time in this mode is determined by the speed at which the drive circuit can establish an appropriate level of gate drive to give linear operation. With the appropriate choice of components the parasitic diode conduction period can be made a small fraction of the total conduction time, so maintaining the overall efficiency of the circuit.

The turn-off of the circuit will now be described.

When S1 closes, current flowing in TR4 is diverted into the driving power supply, which causes the channel resistive voltage drop of TR4 to fall below that which TR1 is attempting to maintain. As a consequence of the feedback mechanism described above, the drive to TR4 reduces to zero because its channel voltage drop no longer exists. TR4 is now switched 'OFF'.

In practice, current will flow into TR4 as its voltage rises because drain/source and drain/gate parasitic capacitors need to be charged. Of these, the latter is more significant because the drive transistor TR3 needs to be able to sink the charging current. In turn, this requires that TR1 can sink the base drive current of TR3. Failure to hold the gate of TR4 at 0V during the voltage-rise period increases its switching loss. Both of these parasitic capacitors, and the finite operating time of the driver, give rise to an effect similar to reverse-recovery current in a bipolar diode.

One factor in this "reverse-recovery current" is the finite time that it takes for the gate drive to reduce to zero when load current is diverted out of TR4. If this diversion is very rapid, TR4 may still be in an ON state as the voltage across it is attempting to rise. This, effectively, transient short circuit caused during the turn-off period can give rise to a large pulse of current.

Also, it is important that the temperature coefficients of TR1 (Vbe) and D1 are matched, otherwise it is possible for the effective voltage reference provided by D2 (to ensure linear operation of the circuit) to be enhanced by the voltage differential between D1 and the Vbe of TR1 and to be above the forward voltage drop of the parasitic diode of TR4. In this condition, the effective reverse-recovery current can increase due to conduction in the parasitic diode, giving rise to higher circuit losses. A solution is to use a transistor of the same type as TR1 (preferably thermally coupled to it) in a "super-diode" configuration to ensure good temperature tracking.

Figure 2:
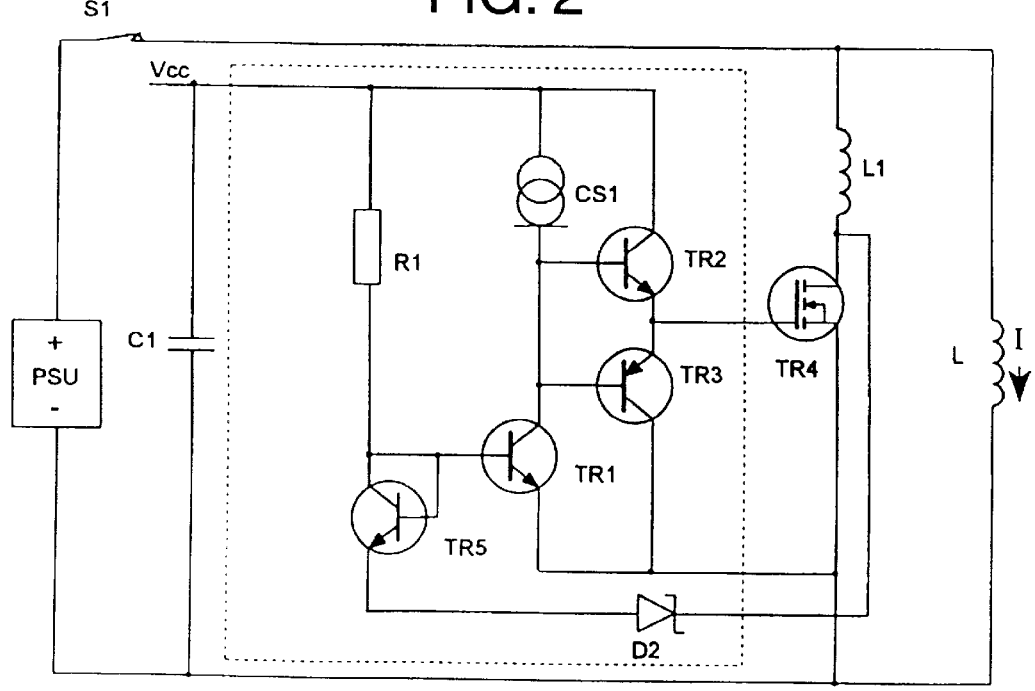
FIG. 2 is an alternative embodiment of the circuit of FIG. 1 with the compensation diode formed by a bipolar transistor in a "super-diode" configuration.

FIG. 2 shows a circuit incorporating this modification where D1 has been replaced. by super-diode TR5.

As will be seen, a small inductor L1 has also been inserted in series with the drain of TR4 L1 provides control of reverse recovery current. It is not part of the basic active rectifier circuit but is used for efficient performance at high frequency. L1 should be a non-linear inductor since it is required to saturate rapidly when drain current flows. It may, for example, be a small bead made from low-loss ferrite, or a bead made from 'square loop' amorphous strip. The purpose of this component is to provide a buffer between TR4 and the source supply when S1 closes.

With S1 open, current flows upwards through TR4 and L1 is saturated. This is as described in connection with FIG. 1. When S1 closes, current transfers instantaneously into the source power supply but no "reverse recovery" current flows in TR4 because of the inductance of L1. Since there is now no 'forward' voltage drop across TR4, the driver stage starts to switch the gate to OFF. The drive for this part of the operation is supplied via R1 into the base of TR1.

L1 must provide sufficient hold-off (the ability to withstand an applied voltage for a given period of time) when S1 closes, otherwise the drive to TR4 may not be fully 'OFF' before it saturates. Ideally, the core should just be on the point of saturation (fully reset) when the voltage across TR4 has reached that of the source supply. This means that reset is dependant, not only on delay time in the driver, but on the time it takes to charge the parasitic drain capacitors of TR4. For this reason, a square-loop material is more suitable for the core because it provides the maximum amount of hold-off for a given size. It should be noted that the flux swing in the core of L1 is very wide and precautions may need to be taken to ensure that it does not overheat when used in high frequency circuits.

Figure 3:
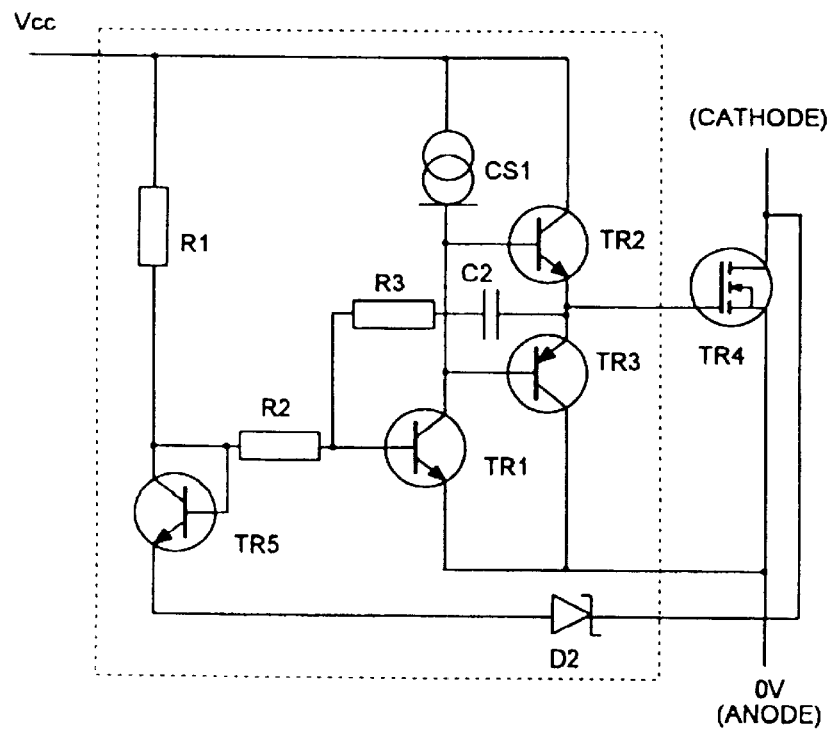
FIG. 3 is a further embodiment of the circuit shown in FIG. 2, including a frequency compensation network for circuit stability.

FIG. 3 shows the addition of resistor R2, resistor R3 and capacitor C2, which are used to ensure stability because the whole circuit operates in a linear feedback mode when TR4 is conducting as a rectifier.

Figure 4:
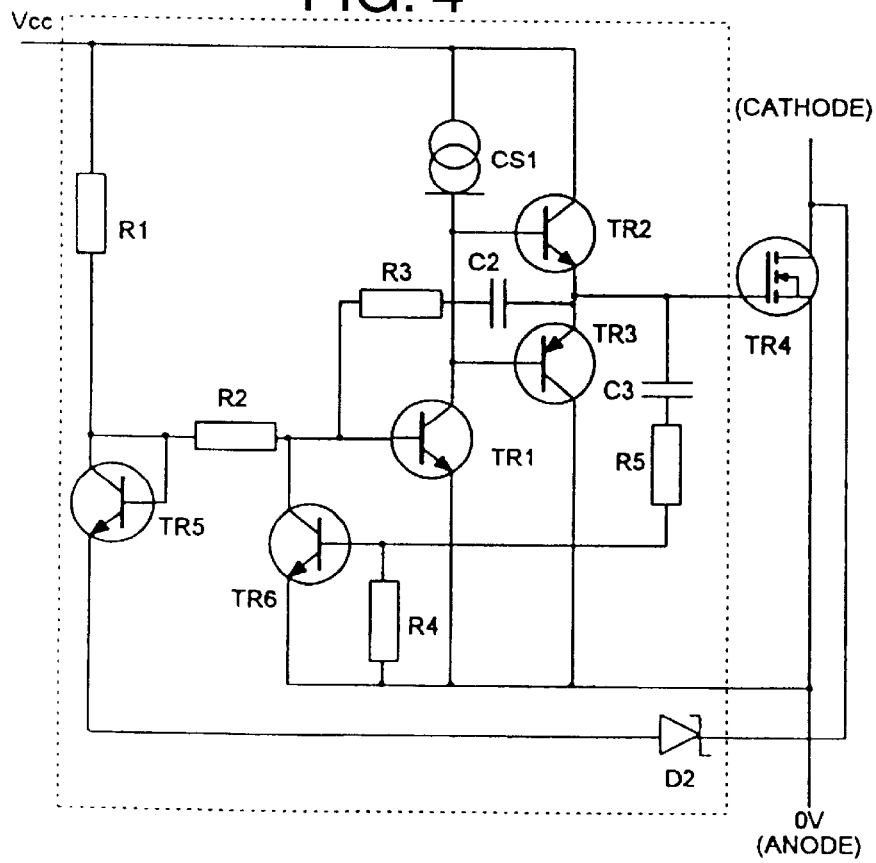
FIG. 4 is a further embodiment of the circuit shown in FIG. 3, including a circuit to increase the speed of turn ON of the rectifier by transiently overdriving the MOSFET.

FIG. 4 shows the addition of transistor TR6, resistor R4, resistor R5 and capacitor C3. These components provide regenerative feedback to give gate overdrive for TR4 at the instant that rectification commences. TR6 is a high-speed switching transistor and the values of R4, R5 and C3 are chosen to control the period of overdrive to the required value.

The operation of the circuit is such that the base of TR1 is shorted to 0V by TR6 when the drive voltage to TR4 begins to rise. The rate-of-rise of voltage is partly controlled by the charging of the parasitic collector/base capacitor of TR1. By preventing this charging current from flowing into the base, the rate-of-rise of collector voltage, and hence TR4 gate voltage, can be increased. This gives a slight improvement in rectifier efficiency because conduction time in the body diode of TR4 is reduced because of the faster transition to controlled conduction.

If the overdrive time is chosen correctly, the circuit will make a transition from saturated to linear operation shortly before the active rectifier is required to turn OFF. In this way, the advantages of both linear and saturated operation can be realised. Saturated operation produces the highest efficiency; linear operation at the instant of turn OFF raises the efficiency by reducing the equivalent reverse recovery current.

Figure 5:
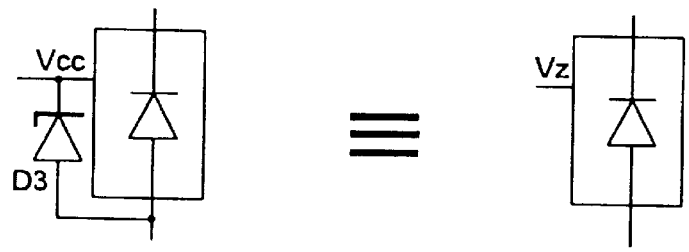
FIG. 5 is a schematic symbol for the rectifier circuit.

FIG. 5 shows a symbol which is used in the subsequent Figures to denote the circuit of FIG. 4. It will be noted that a zener diode D3 is connected between the auxiliary power supply Vcc and the anode. The purpose of this diode is to ensure that the gate drive of TR4 never exceeds a safe value irrespective of the source of the auxiliary supply. Thus each of the circuits described below also incorporate such a zener diode.

Furthermore, all of the circuits described below show a resistive feed from the most positive part of the power circuit to Vz. However, in most cases where the anode of the rectifier circuit is referenced to 0V, a local auxiliary supply may be available. A diode has also been included in the Vz feed in the circuits described below. This has been included to prevent the local Vz decoupling capacitor from discharging through the feed resistor when the rectifier circuit is in full conduction.

Figure 6:
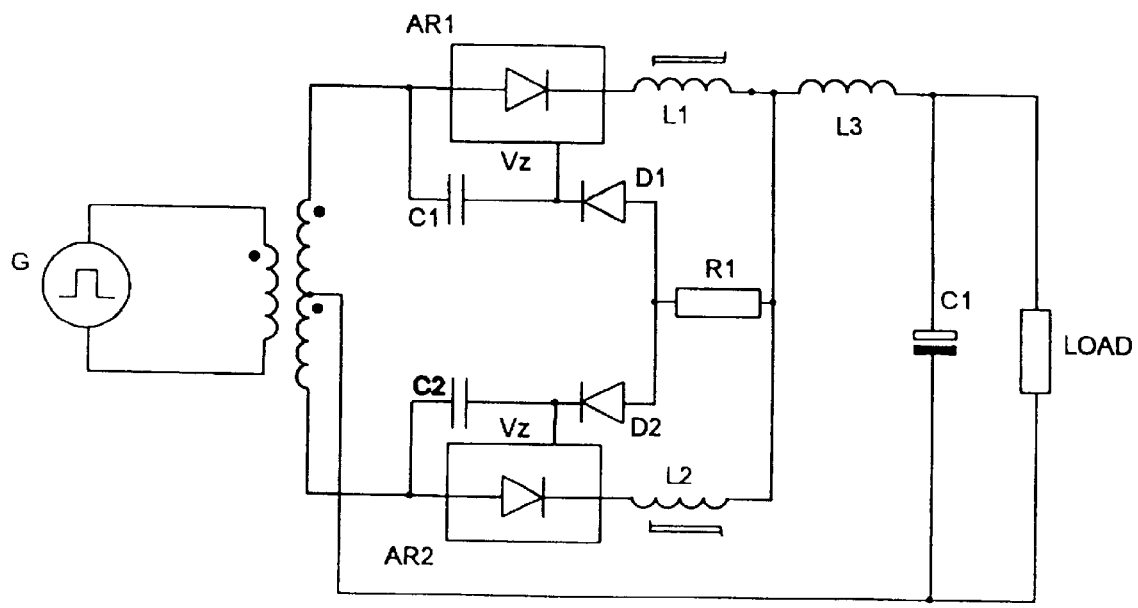
FIG. 6 is a schematic diagram of a bi-phase rectifier circuit incorporating the active rectifier.

FIG. 6 shows a bi-phase rectifier circuit incorporating two of the active rectifiers described above.

Figure 7:
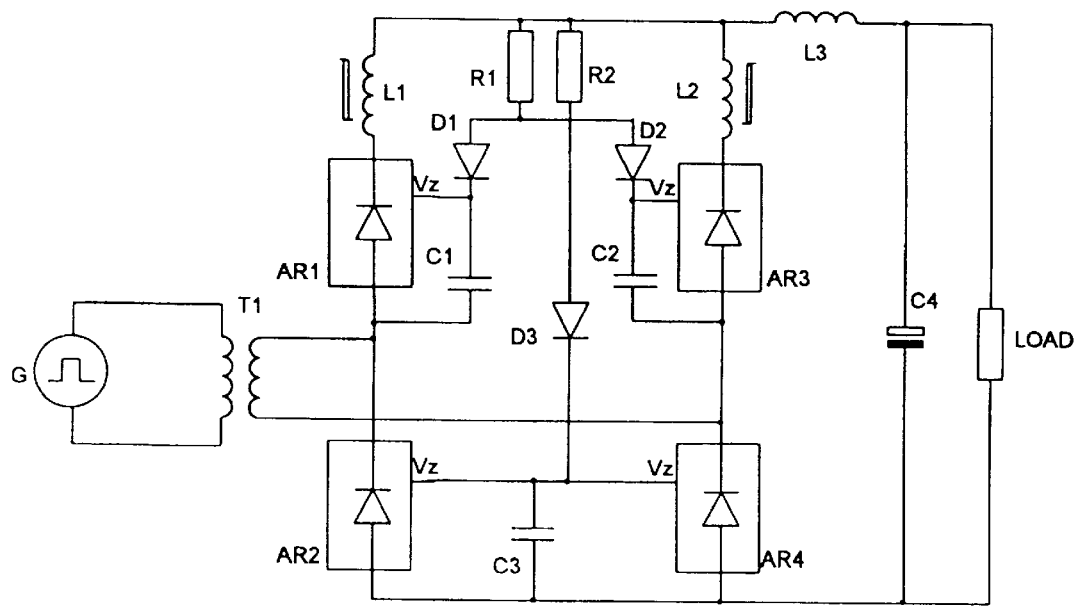
FIG. 7 is a schematic circuit diagram of a full bridge rectifier circuit incorporating the active rectifier.

FIG. 7 shows a full bridge rectifier circuit including four of the active rectifiers described above. It should be noted that although this Figure shows a single phase rectifier circuit, the addition of a third arm would allow three phase rectification. The active rectifier circuit could also be operated in a star or delta configured circuit and in a polyphase system. It is to be noted that the circuits of FIGS. 6 and 7 could operate on a sinusoidal input. The active rectifier is particularly advantageous in such applications since additional drive windings are not required because the circuits are self-commutating.

Figure 8:
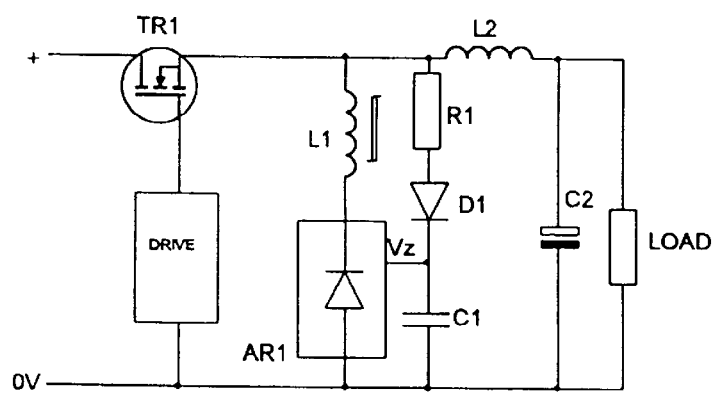
FIG. 8 is a schematic circuit diagram of a buck regulator circuit incorporating the active rectifier.

FIG. 8 shows a buck-regulator circuit incorporating the active rectifier circuit described above.

Figure 9:
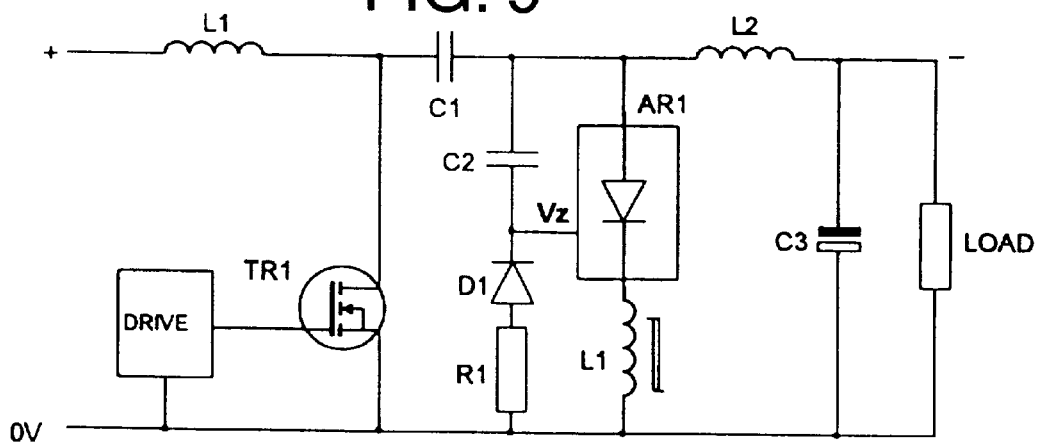
FIG. 9 is a schematic circuit diagram of a CUK converter incorporating the active rectifier.

FIG. 9 shows a CUK converter incorporating an active rectifier as described above.

Figure 10:
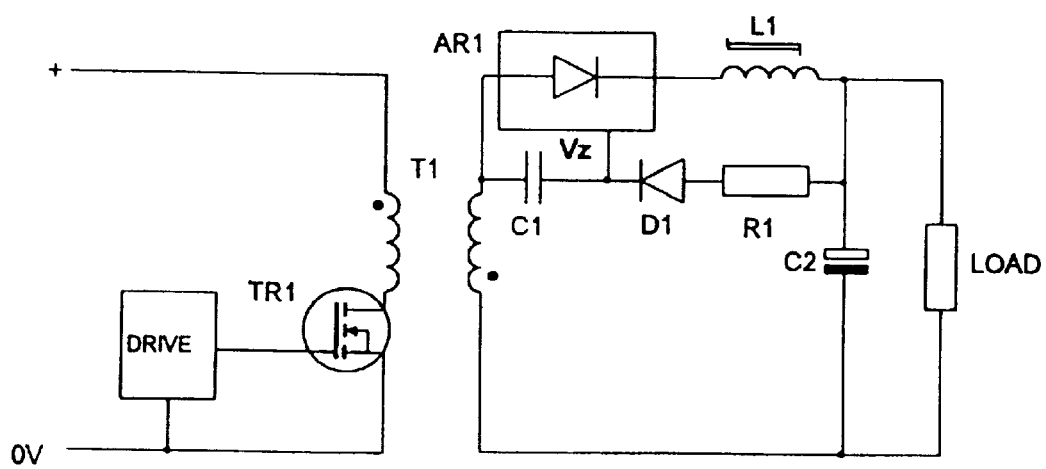
FIG. 10 is a schematic circuit diagram of a transformer-coupled flyback converter incorporating the active rectifier.

FIG. 10 shows a transformer-coupled flyback converter incorporating an active rectifier as described above.

Figure 11:
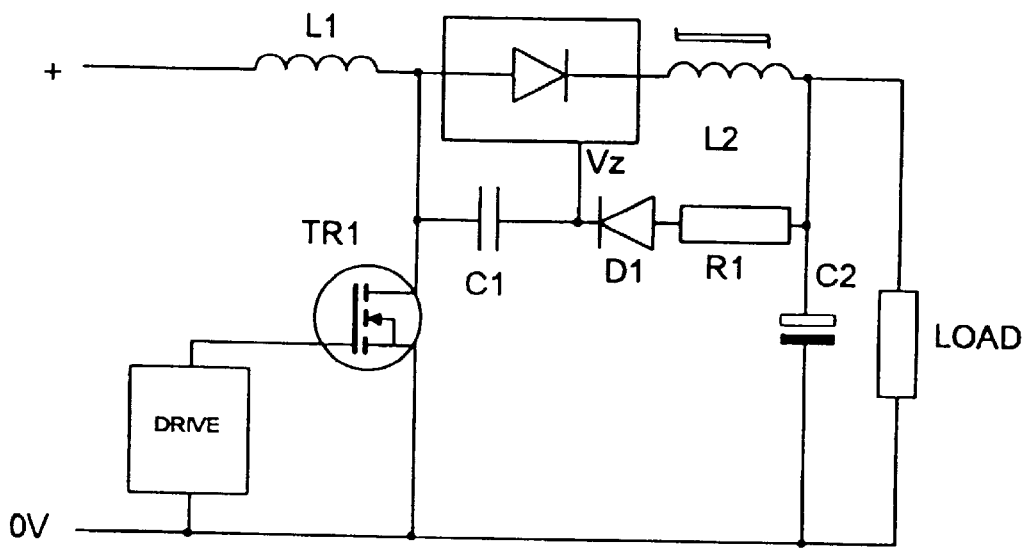
FIG. 11 is a schematic circuit diagram of a boost converter incorporating the active rectifier.

FIG. 11 shows a boost converter circuit incorporating an active rectifier as described above.

Figure 12:
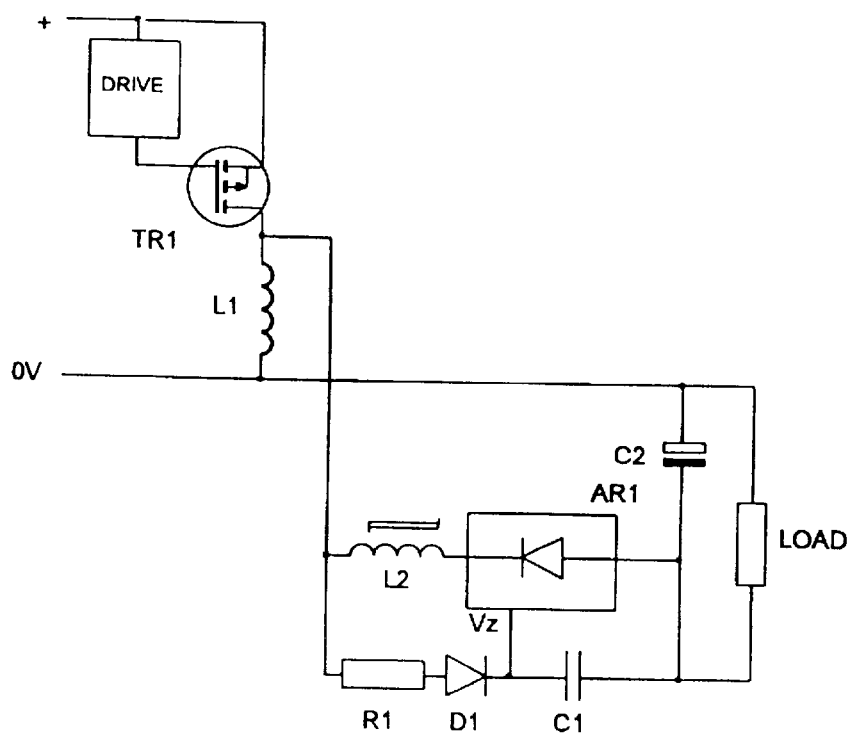
FIG. 12 is a schematic circuit diagram of a flyback converter circuit incorporating the active rectifier.

FIG. 12 shows a flyback converter circuit incorporating an active rectifier as described above.

Figure 13:
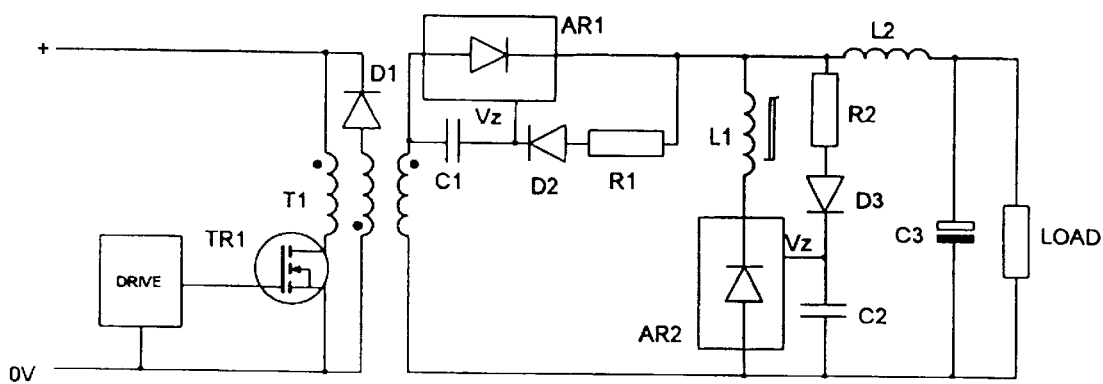
FIG. 13 is a schematic circuit diagram of a forward converter circuit incorporating the active rectifier.

FIG. 13 shows a forward converter circuit incorporating the active rectifier described above. For the circuit of FIG. 13, the series, saturable inductor is not required for the active rectifier circuit because the reverse voltage is driven by the magnetising current of T1 when TR1 turns off. As such, the rate of rise of reverse voltage is controlled by a current source which, by definition, cannot give rise to high recovery currents in the active rectifier circuit.

Since the components of active rectifier described above operate in their unsaturated modes and in particular, the MOSFET TR4 operates in its linear or resistive region, switching times are fast and losses are small. Thus, this circuit has applications in fields, such as the aerospace industry where circuit efficiency is important.

It will be appreciated that although MOSFET TR4 has been shown and described as an n-channel MOSFET, it is, however, possible to operate the circuit using a p-channel MOSFET. In that case, the npn bipolar transistors are swapped for pnp bipolar transistors and vice versa and the polarities of the supplies and diodes are reversed.

It will also be appreciated that the Schottky diode could be replaced with another diode type having a low forward voltage drop.

What is claimed is:

1. An active rectifier comprising, an anode terminal, a cathode terminal, a MOSFET operable to allow current flow from the anode to the cathode, a voltage sensing circuit operable to sense the voltage between the anode and cathode terminals and a gate drive circuit responsive to the voltage sensing circuit and operable to drive the gate of the MOSFET such that the MOSFET conducts when the voltage at the cathode terminal is less than that at the anode terminal and such that the conduction occurs substantially in the unsaturated, linear operating region of the MOSFET.

2. An active rectifier according to claim 1, wherein the voltage sensing circuit includes a voltage reference which is compared with the source-drain voltage of the MOSFET and wherein negative feedback is applied to the gate drive circuit to maintain the source-drain voltage at substantially the same value as the voltage reference.

3. An active rectifier according to claim 1, wherein the MOSFET is an n-channel MOSFET having its drain connected to the cathode terminal and its source connected to the anode terminal.

4. An active rectifier according to claim 1, including a power supply terminal, wherein the voltage sensing circuit comprises a first bipolar npn transistor having its emitter coupled to the anode terminal and its collector coupled to a current source and to the gate drive circuit, a reference diode having its cathode coupled to the cathode terminal, a compensation diode having its cathode coupled to the anode of the reference diode and having a forward voltage characteristic substantially the same as that of the base-emitter junction of the first bipolar transistor, and a first resistance coupled between the power supply terminal and the anode of the compensation diode, the base of the first bipolar transistor being connected to the junction between the first resistance and the compensation diode, and the gate drive circuit being arranged to provide a gate voltage which is generally inversely proportional to the current flowing in the collector of the bipolar transistor, wherein when voltages are applied to the anode terminal and power supply terminal which are greater than a voltage applied to the cathode terminal, the MOSFET is caused to conduct and the gate-source voltage is adjusted to maintain the source-drain voltage at substantially the same level as the forward voltage drop across the reference diode.

5. An active rectifier according to claim 4, including a stabilizing circuit comprising a second resistance and first capacitance connected in series between the base of the first bipolar transistor and the gate of the MOSFET and a third resistance coupled in series with the base of the first bipolar transistor and the compensation diode.

6. An active rectifier according to claim 4, wherein the compensation diode is formed by a second bipolar transistor having substantially the same characteristics as the first bipolar transistor, having its collector and base coupled to the junction between base of the first bipolar transistor and the first resistance and having its emitter connected to the anode of the reference diode.

7. An active rectifier according to claim 6, including a stabilizing circuit comprising a second resistance and first capacitance connected in series between the base of the first bipolar transistor and the gate of the MOSFET and a third resistance coupled in series with the bases of the first and second bipolar transistors.

8. An active rectifier according to claim 4, wherein the reference diode is a schottky diode.

9. An active rectifier according to claim 1, including a regenerative feedback circuit comprising a feedback bipolar transistor having its collector coupled to the base of the first bipolar transisitor and its emitter coupled to the anode terminal, a capacitance and a resistance coupled in series between the gate of the MOSFET and the base of the feedback bipolar transistor and a further resistance coupled between the base of the feedback bipolar transistor and the anode terminal.

10. A rectifier circuit including the active rectifier of claim 1.

11. A regulator circuit including the active rectifier of claim 1.

12. A converter circuit including the active rectifier of claim 1.

* * * * *